US012293693B2

(12) United States Patent
Pyun et al.

(10) Patent No.: US 12,293,693 B2
(45) Date of Patent: May 6, 2025

(54) CURRENT SENSOR AND DISPLAY DEVICE INCLUDING THE SAME

(71) Applicant: Samsung Display Co., Ltd., Yongin-Si (KR)

(72) Inventors: Kihyun Pyun, Gwangmyeong-si (KR); Jang-Mi Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 127 days.

(21) Appl. No.: 18/079,607

(22) Filed: Dec. 12, 2022

(65) Prior Publication Data
US 2023/0274686 A1 Aug. 31, 2023

(30) Foreign Application Priority Data

Feb. 28, 2022 (KR) .................. 10-2022-0026280

(51) Int. Cl.
*G09G 3/20* (2006.01)
*G01R 19/165* (2006.01)

(52) U.S. Cl.
CPC ..... *G09G 3/2096* (2013.01); *G01R 19/16571* (2013.01); *G09G 3/2007* (2013.01); *G09G 2300/0828* (2013.01); *G09G 2330/021* (2013.01)

(58) Field of Classification Search
None
See application file for complete search history.

(56) References Cited

U.S. PATENT DOCUMENTS

| 10,008,157 | B2* | 6/2018 | Kim ...................... G09G 3/3225 |
| 2014/0084792 | A1* | 3/2014 | Oh .......................... H05B 47/10 |
| | | | 315/120 |
| 2019/0340965 | A1* | 11/2019 | Chang .................... G09G 3/006 |
| 2021/0201815 | A1* | 7/2021 | Bong .................... G09G 3/3266 |
| 2023/0081260 | A1* | 3/2023 | Lee ....................... G09G 3/3291 |
| | | | 345/94 |
| 2023/0081453 | A1* | 3/2023 | Liu ........................ H05B 45/38 |
| | | | 345/691 |

FOREIGN PATENT DOCUMENTS

| KR | 100623802 B1 | 9/2006 |
| KR | 100707619 B1 | 4/2007 |
| KR | 101177907 B1 | 8/2012 |

* cited by examiner

*Primary Examiner* — Amare Mengistu
*Assistant Examiner* — Sarvesh J Nadkarni
(74) *Attorney, Agent, or Firm* — Innovation Counsel LLP (57) ABSTRACT

A display device may include a display panel which displays an image based on image data, a power supply which provides a driving voltage to the display panel through a power line, a current sensor which generates first current data including average, minimum, and maximum sensing currents of a first period based on sensing currents generated by sampling a current flowing through the power line at a sampling frequency, generates second current data including average, minimum, and maximum sensing currents of a second period less than the first period based on the sensing currents, and includes a first controller controlling the image data or the power supply based on the second current data, and a timing controller which communicates with the current sensor, and includes a second controller controlling the image data or the power supply based on the first and second current data.

19 Claims, 7 Drawing Sheets

CURRENT SENSOR AND DISPLAY DEVICE INCLUDING THE SAME

CROSS-REFERENCE TO RELATED APPLICATION(S)

This application claims priority under 35 USC § 119 to Korean Patent Application No. 10-2022-0026280 filed on Feb. 28, 2022, in the Korean Intellectual Property Office (KIPO), the entire disclosure of which is incorporated by reference herein.

BACKGROUND

1. Field

Embodiments relate to a display device. More particularly, embodiments related to a current sensor for sensing a current flowing through a display panel and a display device including the current sensor.

2. Description of the Related Art

A display device may include a display panel that displays an image, drivers that provide signals to the display panel, and a power supply that provides a driving voltage to the display panel. The display device may further include a current sensor that generates a sensing current by sensing a current flowing through the display panel, and a plurality of controllers that control the display panel based on the sensing current.

Each of the controllers may use the sensing current to control a luminance of the image, to control a magnitude of the driving voltage, or to control a supply of the driving voltage. Various sensing currents may be required to drive the controllers, and it may be necessary to quickly provide the sensing currents to the controllers.

SUMMARY

Embodiments provide a current sensor quickly providing various sensing currents.

Embodiments provide a display device including the current sensor.

A display device according to embodiments may include a display panel which displays an image based on image data, a power supply which provides a driving voltage to the display panel through a power line, a current sensor which generates first current data including an average sensing current, a minimum sensing current, and a maximum sensing current of a first period based on sensing currents generated by sampling a current flowing through the power line at a sampling frequency, generates second current data including an average sensing current, a minimum sensing current, and a maximum sensing current of a second period shorter than the first period based on the sensing currents, and includes a first controller controlling the image data or the power supply based on the second current data, and a timing controller which communicates with the current sensor every frame period, and includes a second controller controlling the image data or the power supply based on the first current data and the second current data.

In an embodiment, the second period may be shorter than a frame period.

In an embodiment, the current sensor may further include a first current data generator which generates the first current data based on the sensing currents, and a second current data generator which generates the second current data based on the sensing currents.

In an embodiment, the current sensor may further include a third current data generator which generates third current data including an average sensing current, a minimum sensing current, and a maximum sensing current of a third period longer than the first period based on the sensing currents.

In an embodiment, the first period may be equal to the frame period, and the third period may be equal to a plurality of frame periods.

In an embodiment, the current sensor may further include an analog-to-digital converter which converts a voltage between opposite terminals of a sensing resistor connected to the power line into the sensing currents based on the sampling frequency.

In an embodiment, the current sensor may further include a current transmission memory which stores the first current data and the second current data. The timing controller may further include a current receiving memory which receives the first current data and the second current data from the current transmission memory and stores the first current data and the second current data.

In an embodiment, the current transmission memory and the current receiving memory may communicate using an I2C interface.

In an embodiment, the first controller may include an over-current detector which generates a control signal for controlling a magnitude of the driving voltage based on the second current data.

In an embodiment, the timing controller may further include net power controller which generates a load of the image data based on the image data.

In an embodiment, the second controller may include a global current manager which controls a grayscale of the image data based on the average sensing current of the first current data, the average sensing current of the second current data, and the load of the image data.

In an embodiment, the second controller may include an over-current protector which generates a control signal for controlling a supply of the driving voltage to the display panel based on the maximum sensing current of the first current data, the maximum sensing current of the second current data, and the load of the image data.

In an embodiment, the second controller may include a current detection burnt protector which generates a control signal for controlling a supply of the driving voltage to the display panel based on the minimum sensing current and the maximum sensing current of the first current data, and the minimum sensing current and the maximum sensing current of the second current data.

A current sensor according to embodiments may include a first current data generator which generates first current data including an average sensing current, a minimum sensing current, and a maximum sensing current of a first period based on sensing currents generated by sampling a current flowing through a power line, which provides a driving voltage to a display panel from a power supply, at a sampling frequency, a second current data generator which generates second current data including an average sensing current, a minimum sensing current, and a maximum sensing current of a second period shorter than the first period based on the sensing currents, and a controller which controls the image data or the power supply based on the second current data. The current sensor may transmit the first current data and the second current data to a timing controller every frame period.

In an embodiment, the second period may be shorter than a frame period.

In an embodiment, the current sensor may further include a third current data generator which generates third current data including an average sensing current, a minimum sensing current, and a maximum sensing current of a third period longer than the first period based on the sensing currents.

In an embodiment, the first period may be equal to a frame period, and the third period may be equal to a plurality of frame periods.

In an embodiment, the current sensor may further include an analog-to-digital converter which converts a voltage between opposite terminals of a sensing resistor connected to the power line into the sensing currents based on the sampling frequency.

In an embodiment, the current sensor may further include a current transmission memory which stores the first current data and the second current data, and transmits the first current data and the second current data to the timing controller.

In an embodiment, the controller may include an over-current detector which generates a control signal for controlling a magnitude of the driving voltage based on the second current data.

In the current sensor and the display device according to the embodiments, the current sensor may generate the various sensing currents, so that the sensing currents suitable for different controllers may be provided. Further, the current sensor may include the first controller, so that the sensing currents may be quickly provided to the first controller.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, a display device and a current sensor according to embodiments will be described in more detail with reference to the accompanying drawings. The same or similar reference numerals will be used for the same elements in the accompanying drawings.

Figure 1:
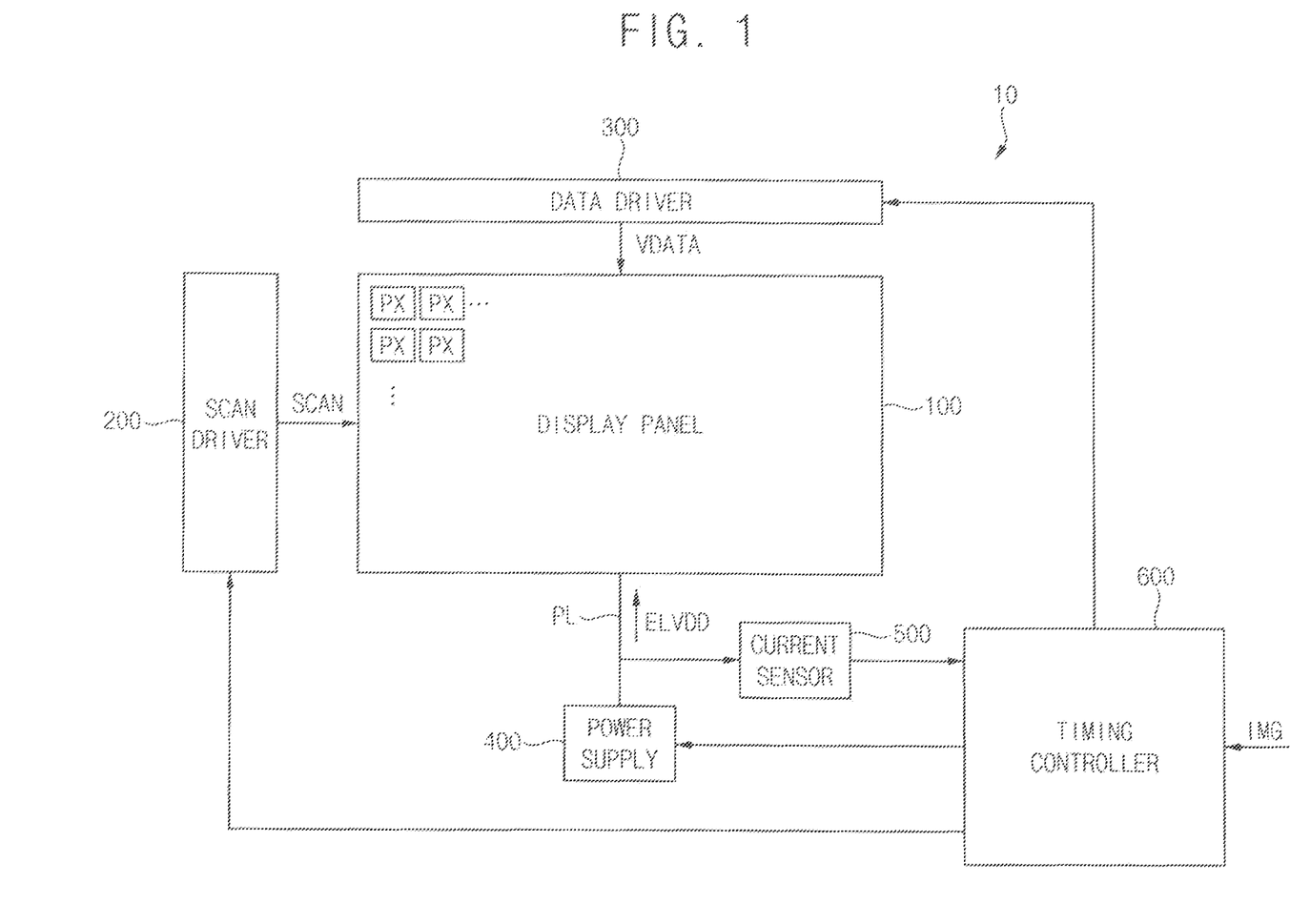
FIG. 1 is a block diagram illustrating a display device according to an embodiment.

FIG. 1 is a block diagram illustrating a display device 10 according to an embodiment.

Referring to FIG. 1, the display device 10 may include a display panel 100, a scan driver 200, a data driver 300, a power supply 400, a current sensor 500, and a timing controller 600.

The display panel 100 may display an image based on image data IMG. The display panel 100 may include various display elements such as an organic light emitting diode ("OLED") or the like. Hereinafter, the display panel 100 including the organic light emitting diode as a display element will be described for convenience. However, the present disclosure is not limited thereto, and the display panel 100 may include various display elements such as a liquid crystal display ("LCD") element, an electrophoretic display ("EPD") element, an inorganic light emitting diode, or the like.

The display panel 100 may include a plurality of pixels PX. Each of the pixels PX may receive a scan signal SCAN, a data voltage VDATA, and a driving voltage ELVDD. Each of the pixels PX may emit light based on the scan signal SCAN, the data voltage VDATA, and the driving voltage ELVDD.

The scan driver 200 (or a gate driver) may generate the scan signal SCAN (or a gate signal) and may provide the scan signal SCAN to the pixels PX. The scan driver 200 may be implemented as a shift register, but the configuration of the scan driver 200 is not limited thereto. In an embodiment, the scan driver 200 may be formed on the display panel 100. In another embodiment, the scan driver 200 may be implemented as an integrated circuit and the integrated circuit may be mounted on a flexible circuit board to be connected to the display panel 100.

The data driver 300 (or a source driver) may generate the data voltage VDATA and may provide the data voltage VDATA to the pixels PX. In an embodiment, the data driver 300 may be implemented as an integrated circuit (e.g., a driver IC) and may be mounted on a flexible circuit board to be connected to the display panel 100.

The power supply 400 may generate the driving voltage ELVDD and may provide the driving voltage ELVDD to the pixels PX. A power line PL may electrically connect the power supply 400 to the display panel 100 and the power supply 400 may provide the driving voltage ELVDD to the display panel 100 through the power line PL. In an embodiment, the power supply 400 may be implemented as an integrated circuit IC (e.g., a driver IC) and may be mounted on a flexible circuit board to be connected to the display panel 100.

The current sensor 500 may sense a current flowing through the power line PL to generate current data including a plurality of sensing currents and may provide the current data to the timing controller 600. Configurations and operation of the current sensor 500 will be described below with reference to FIGS. 2 to 6.

The timing controller 600 may control a driving of the scan driver 200, a driving of the data driver 300, and a driving of the power supply 400. The timing controller 600 may generate a data signal based on the image data IMG and may provide the data signal to the data driver 300.

FIG. 1 illustrates that the timing controller 600 is implemented independently of the data driver 300, however, the present disclosure is not limited thereto. For example, the timing controller 600 may be implemented as a single integrated circuit together with the data driver 300.

Configurations and operation of the timing controller 600 will be described below with reference to FIGS. 2 to 6.

Further, FIG. 1 illustrates that the power supply 400 and the current sensor 500 are implemented independently of the data driver 300 or the timing controller 600, however, the present disclosure is not limited thereto. For example, the power supply 400 and/or the current sensor 500 may be implemented as a single integrated circuit together with the data driver 300 and/or the timing controller 600, or may be included in the data driver 300 and/or the timing controller 600 and partially or entirely implemented in software.

Figure 2:
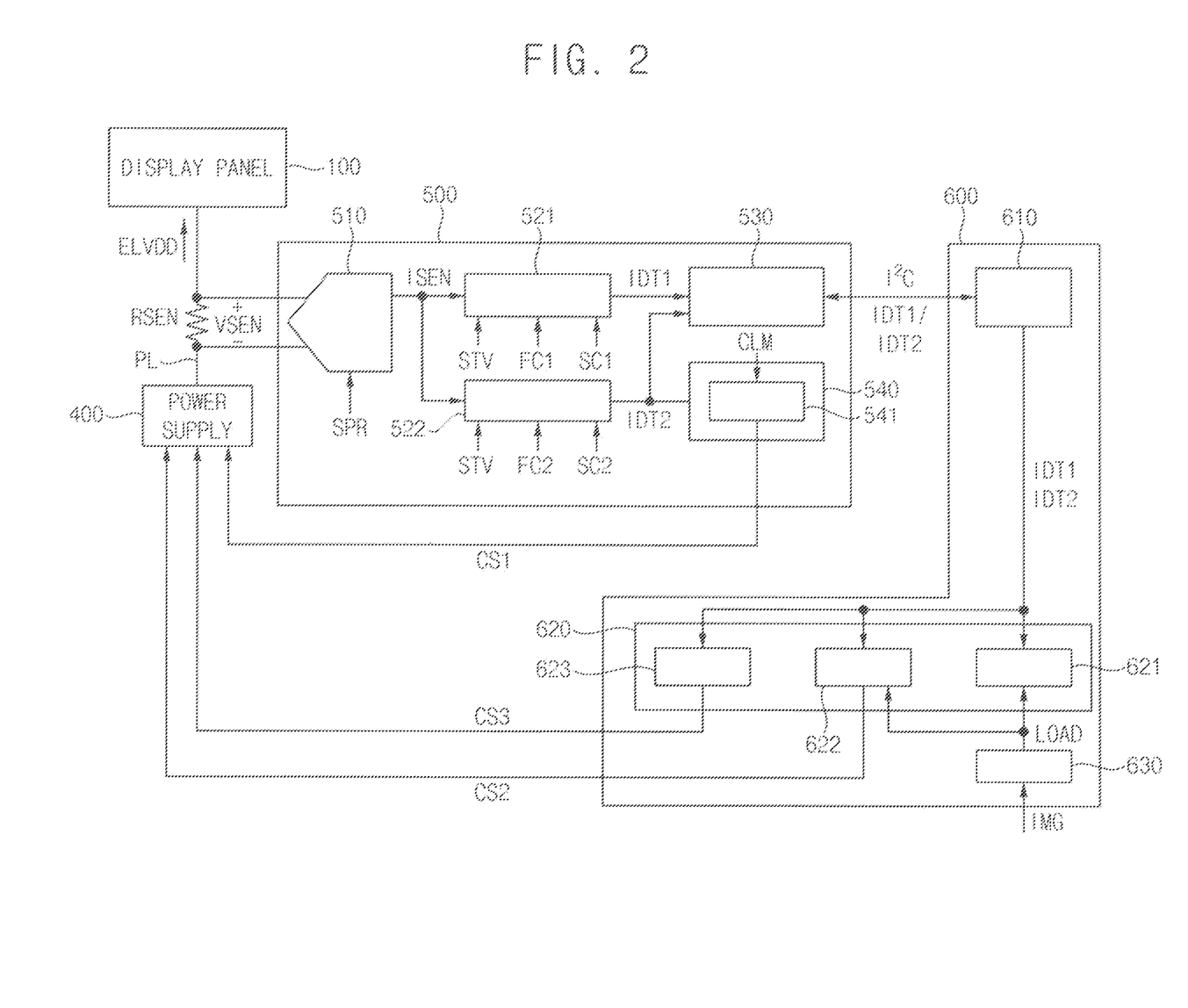
FIG. 2 is a block diagram illustrating a current sensor and a timing controller according to an embodiment.
Figure 3:
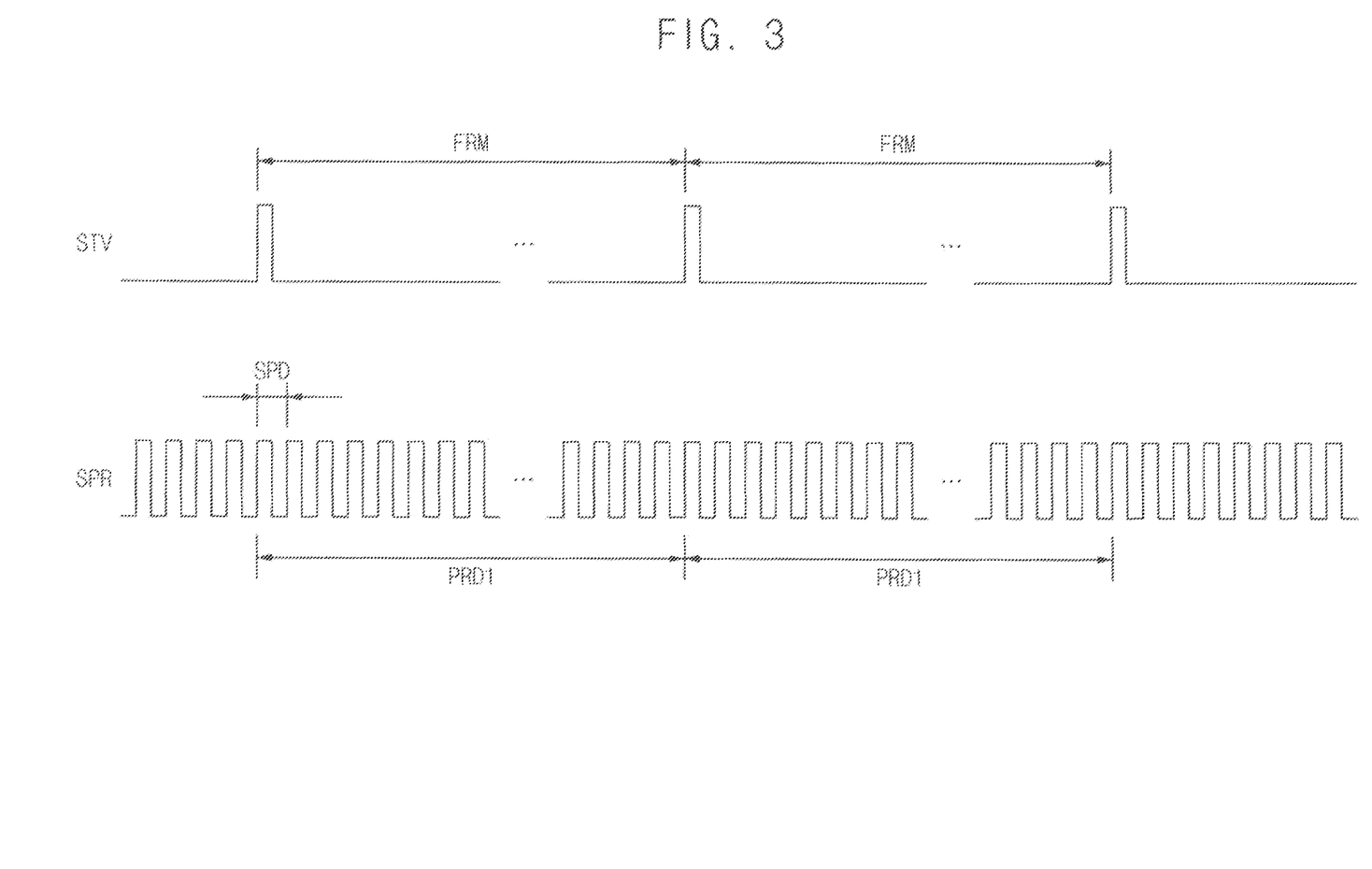
FIG. 3 is a diagram for describing a method of generating first current data according to an embodiment.
Figure 4:
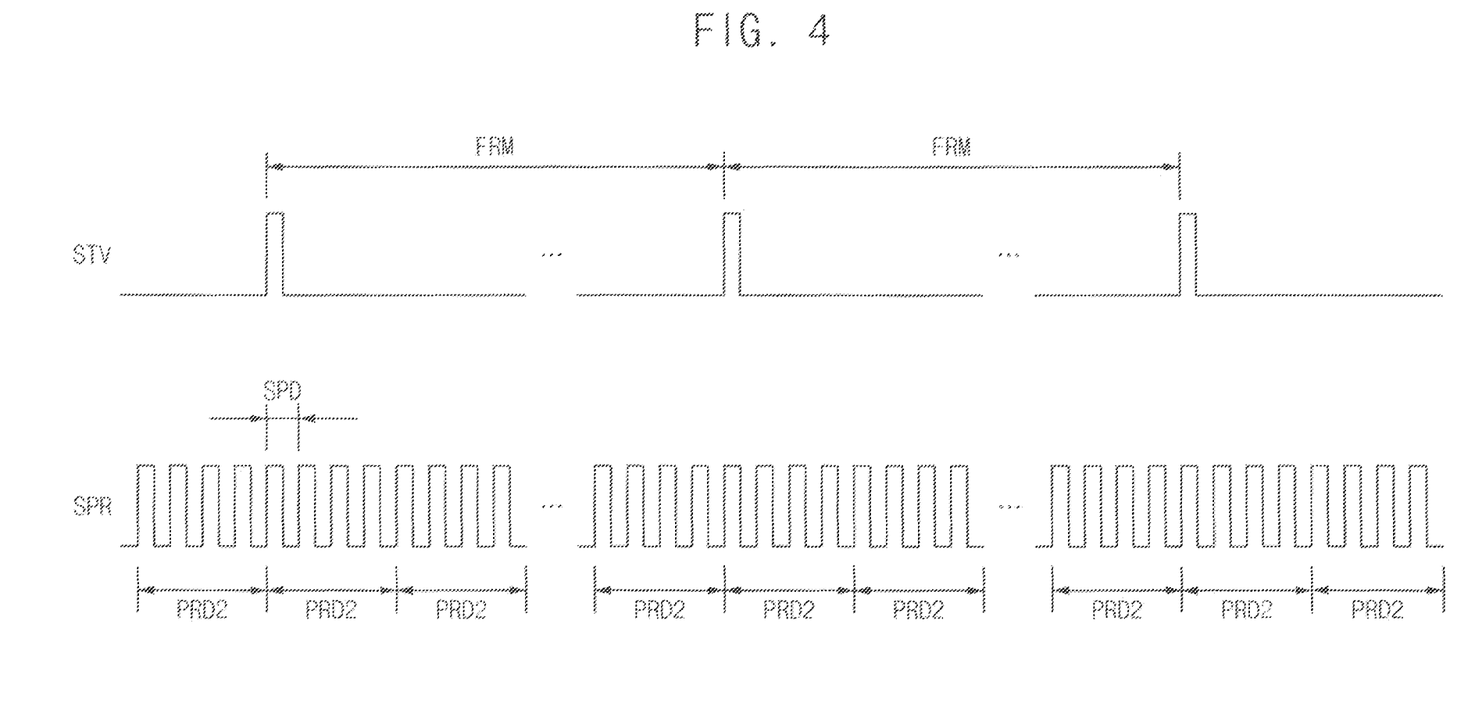
FIG. 4 is a diagram for describing a method of generating second current data according to an embodiment.

FIG. 2 is a block diagram illustrating a current sensor 500 and a timing controller 600 according to an embodiment. FIG. 3 is a diagram for describing a method of generating first current data IDT1 according to an embodiment. FIG. 4 is a diagram for describing a method of generating second current data IDT2 according to an embodiment.

Referring to FIGS. 2, 3, and 4, the current sensor 500 may generate sensing currents ISEN by sampling a current flowing through the power line PL at a sampling frequency SPR, may generate the first current data IDT1 including an average sensing current, a minimum sensing current, and a maximum sensing current of a first period PRD1 based on the sensing currents ISEN, may generate the second current data IDT2 including an average sensing current, a minimum sensing current, and a maximum sensing current of a second period PRD2 based on the sensing currents ISEN, and may transmit the first current data IDT1 and the second current data IDT2 to the timing controller 600. The current sensor 500 may include an analog-to-digital converter 510, a first current data generator 521, a second current data generator 522, a current transmission memory 530, and a first controller 540.

The analog-to-digital converter ("ADC") 510 may convert a voltage VSEN between opposite terminals of a sensing resistor RSEN connected to the power line PL into the sensing currents ISEN based on the sampling frequency SPR. The sensing resistor RSEN may be disposed between a first portion of the power line PL connected to the power supply 400 and a second portion of the power line PL connected to the display panel 100. The voltage VSEN between the opposite terminals of the sensing resistor RSEN may be proportional to the current flowing through the power line PL. The analog-to-digital converter 510 may convert the analog-type voltage VSEN into the digital-type sensing currents ISEN a number of times corresponding to the sampling frequency SPR. The analog-to-digital converter 510 may provide the sensing currents ISEN to the first current data generator 521 and the second current data generator 522.

In an embodiment, the sampling frequency SPR may be about 200 kHz to about 1 MHz. In such an embodiment, the analog-to-digital converter 510 may convert the voltage VSEN between the opposite terminals of the sensing resistor RSEN into the sensing currents ISEN from about 1666 times to about 8333 times during one frame period FRM.

The first current data generator 521 may generate the first current data IDT1 including the average sensing current, the minimum sensing current, and the maximum sensing current of the first period PRD1 based on the sensing currents ISEN, a vertical start signal STV, a first frame count FC1, and a first sensing count SC1. The first period PRD1 may be synchronized by the vertical start signal STY. The first frame count FC1 may be the number of frame periods FRM included in the first period PRD1. When the first frame count FC1 is 0, the first frame count FC1 may be disabled. The first sensing count SC1 may be the number of sensing periods SPD included in the first period PRD1. When the first sensing count SC1 is 0, the first sensing count SC1 may be disabled.

The first current data generator 521 may generate the first current data IDT1 based on the sensing currents ISEN sensed a number of times corresponding to the sampling frequency SPR during the first period PRD1. The first current data generator 521 may provide the first current data IDT1 to the current transmission memory 530.

The average sensing current of the first period PRD1 may be an average value of the sensing currents ISEN in the first period PRD1. The minimum sensing current of the first period PRD1 may be a minimum value of the sensing currents ISEN in the first period PRD1. The maximum sensing current of the first period PRD1 may be a maximum value of the sensing currents ISEN in the first period PRD1.

In an embodiment, the first period PRD1 may be equal to one frame period FRM. In such an embodiment, the first frame count FC1 may be 1, and the first sensing count SC1 may be 0.

The second current data generator 522 may generate the second current data IDT2 including the average sensing current, the minimum sensing current, and the maximum sensing current of the second period PRD2 based on the sensing currents ISEN, the vertical start signal STV, a second frame count FC2, and a second sensing count SC2. The second period PRD2 may be synchronized by the vertical start signal STV. The second frame count FC2 may be the number of frame periods FRM included in the second period PRD2. When the second frame count FC2 is 0, the second frame count FC2 may be disabled. The second sensing count SC2 may be the number of sensing periods SPD included in the second period PRD2. When the second sensing count SC2 is 0, the second sensing count SC2 may be disabled.

The second current data generator 522 may generate the second current data IDT2 based on the sensing currents ISEN sensed a number of times corresponding to the sampling frequency SPR during the second period PRD2. The second current data generator 522 may provide the second current data IDT2 to the current transmission memory 530 and the first controller 540.

The average sensing current of the second period PRD2 may be an average value of the sensing currents ISEN in the second period PRD2. The minimum sensing current of the second period PRD2 may be a minimum value of the sensing currents ISEN in the second period PRD2. The maximum sensing current of the second period PRD2 may be a maximum value of the sensing currents ISEN in the second period PRD2.

The second period PRD2 may be shorter than the first period PRD1. The second period PRD2 may be equal to a plurality of sampling periods SPD. In an embodiment, the second period PRD2 may be shorter than the frame period FRM. For example, the second period PRD2 may be equal to four sampling periods SPD. In this case, the second frame count FC2 may be 0, and the second sensing count SC2 may be 4.

The current transmission memory 530 may store the first current data IDT1 and the second current data IDT2. The current transmission memory 530 may transmit the first current data IDT1 and the second current data IDT2 to the timing controller 600.

The first controller 540 may control the image data IMG and/or the power supply 400 based on the second current data IDT2. In an embodiment, the first controller 540 may include an over-current detector 541.

The over-current detector ("OCD") 541 may generate a first control signal CS1 for controlling a magnitude of the driving voltage ELVDD based on the second current data IDT2. The over-current detector 541 may compare at least one of the average sensing current, the minimum sensing current, and the maximum sensing current of the second period PRD2 included in the second current data IDT2 with a limit current CLM to generate the first control signal CS1. For example, when one of the average sensing current, the minimum sensing current, and the maximum sensing current of the second period PRD2 is greater than the limit current CLM, the over-current detector 541 may generate the first control signal CS1 for reducing the magnitude of the driving voltage ELVDD.

The over-current detector 541 may be required to quickly control the magnitude of the driving voltage ELVDD in response to changes in the sensing currents ISEN. The current sensor 500 may include the first controller 540 and the second current data generator 522 may provide the second current data IDT2 to the first controller 540, so that the over-current detector 541 may quickly control the magnitude of the driving voltage ELVDD.

The timing controller 600 may communicate with the current sensor 500 every frame period FRM. The timing controller 600 may include a current receiving memory 610, a second controller 620, and a net power controller 630.

The current receiving memory 610 may receive the first current data IDT1 and the second current data IDT2 from the current transmitting memory 530 and may store the first current data IDT1 and the second current data IDT2. The current receiving memory 610 may provide the first current data IDT1 and the second current data IDT2 to the second controller 620. In an embodiment, the current transmission memory 530 and the current receiving memory 610 may communicate using an I2C interface.

The second controller 620 may control the image data IMG or the power supply 400 based on the first current data IDT1 and the second current data IDT2. In an embodiment, the second controller 620 may include a global current manager 621, an over-current protector 622, and a current sensing burnt protector 623.

The global current manager ("GCM") 621 may control a grayscale of the image data IMG based on the average sensing current of the first current data IDT1, the average sensing current of the second current data IDT2, and a load LOAD of the image data IMG. The global current manager 621 may calculate a global current from the load LOAD, and may compare the average sensing current of the first current data IDT1 and the average sensing current of the second current data IDT2 with the global current, and may control the grayscale of the image data IMG to reduce a power consumption of the display panel 100.

The over-current protector ("OCP") 622 may generate a second control signal CS2 for controlling a supply of the driving voltage ELVDD to the display panel 100 based on the maximum sensing current of the first current data IDT1, the maximum sensing current of the second current data IDT2, and the load LOAD. The over-current protector 622 may calculate a global current from the load LOAD and may compare the maximum sensing current of the first current data IDT1 and the maximum sensing current of the second current data IDT2 with a reference current having a predetermined ratio with respect to the global current to generate the second control signal CS2. For example, when one of the maximum sensing current of the first current data IDT1 and the maximum sensing current of the second current data IDT2 is greater than the reference current, the over-current protector 622 may generate the second control signal CS2 for blocking the supply of the driving voltage ELVDD to the display panel 100.

The current sensing burnt protector ("CSBP") 623 may generate a third control signal CS3 for controlling a supply of the driving voltage ELVDD to the display panel 100 based on the minimum sensing current and the maximum sensing current of the first current data IDT1, and the minimum sensing current and the maximum sensing current of the second current data IDT2. The current sensing burnt protector 623 may compare the minimum sensing current and the maximum sensing current of the first current data IDT1, and the minimum sensing current and the maximum sensing current of the second current data IDT2 with a reference current that is a reference for determining whether or not the burnt occurs to generate the third control signal CS3. For example, when one of the minimum sensing current and the maximum sensing current of the first current data IDT1, and the minimum sensing current and the maximum sensing current of the second current data IDT2 are greater than the reference current, the current sensing burnt protector 623 may generate the third control signal CS3 for blocking the supply of the driving voltage ELVDD to the display panel 100.

The net power controller 630 may generate the load LOAD of the image data IMG based on the image data IMG. The net power controller 630 may calculate the load LOAD of the image data IMG based on sum of total grayscale values of the image data IMG.

The global current manager 621 may be required to control the grayscale of the image data IMG based on an accurate average sensing current. The over-current protector 622 may be required to control the supply of the driving voltage ELVDD to the display panel 100 based on an accurate maximum sensing current. The current sensing burnt protector 623 may be required to control the supply of the driving voltage ELVDD to the display panel 100 based on accurate minimum and maximum sensing currents. The first current data IDT1 and the second current data IDT2 including various sensing currents may be provided to the second controller 620, so that the global current manager 621 may accurately control the grayscale of the image data IMG, and the over-current protector 622 and the current sensing burnt protector 623 may accurately control the supply of the driving voltage ELVDD to the display panel 100.

Figure 5:
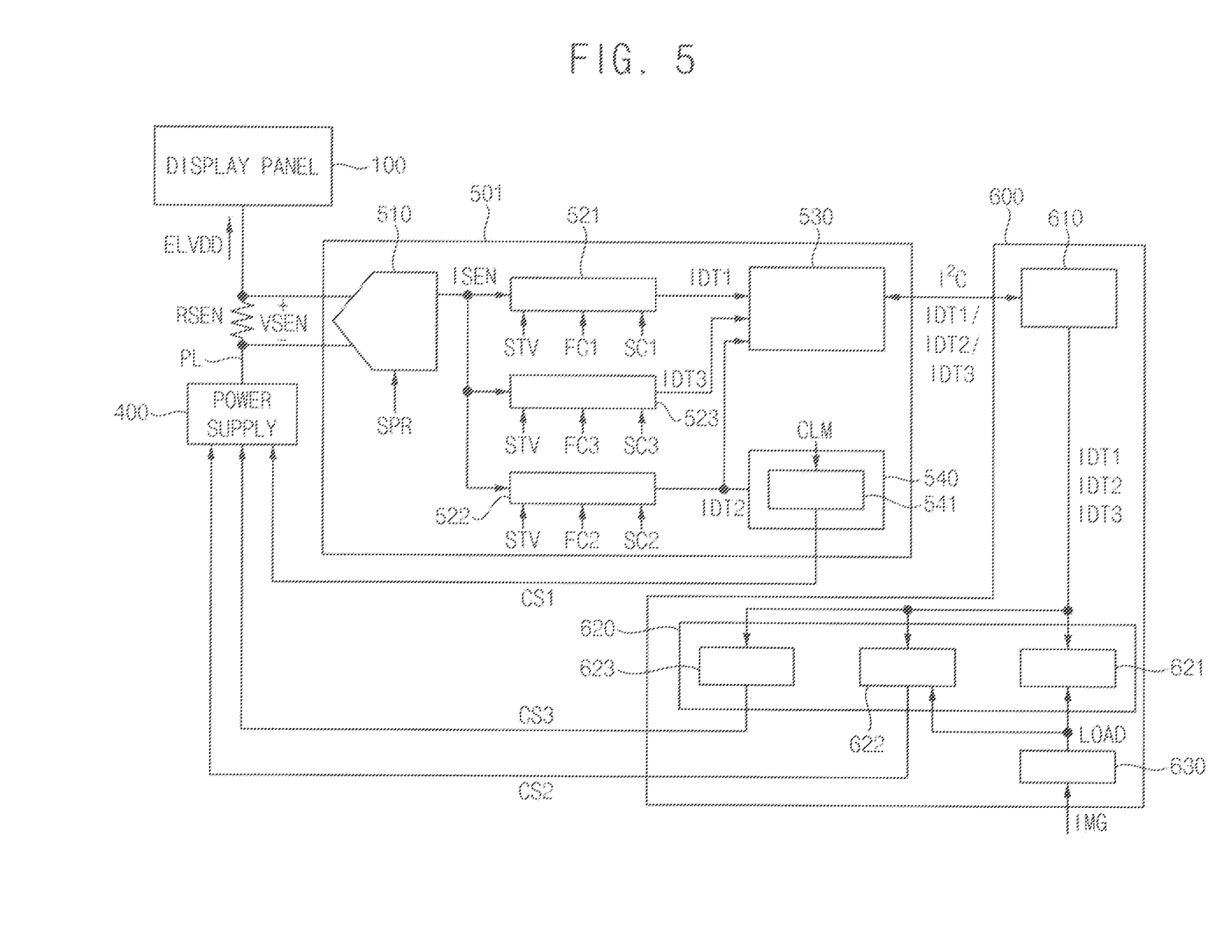
FIG. 5 is a block diagram illustrating a current sensor and a timing controller according to an embodiment.
Figure 6:
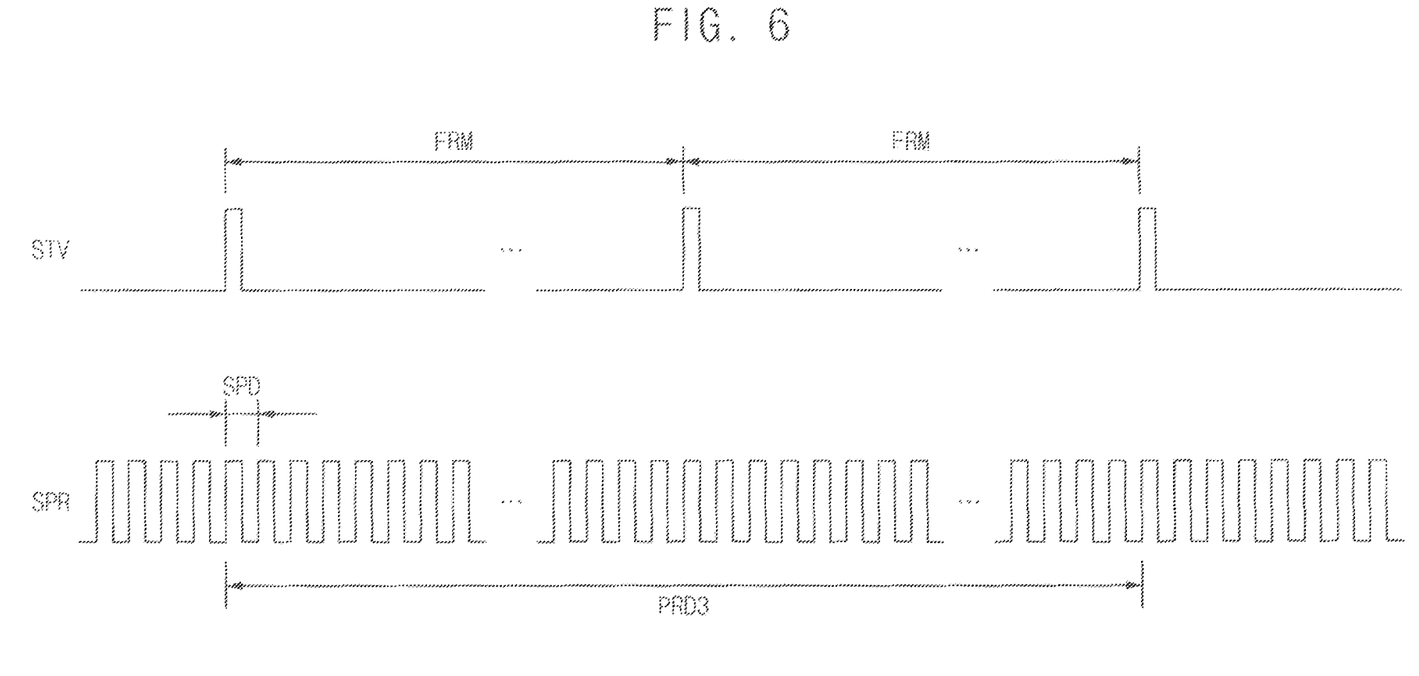
FIG. 6 is a diagram for describing a method of generating third current data according to an embodiment.

FIG. 5 is a block diagram illustrating a current sensor 501 and a timing controller 600 according to an embodiment. FIG. 6 is a diagram for describing a method of generating third current data IDT3 according to an embodiment.

The current sensor 501 and the timing controller 600 described with reference to FIGS. 5 and 6 may be substantially the same as or similar to the current sensor 500 and the timing controller 600 described with reference to FIGS. 2 to 4 except that a current sensor 501 further includes a third current data generator 523. Accordingly, descriptions of the overlapping components will be omitted.

Referring to FIGS. 5 and 6, the current sensor 501 may generate sensing currents ISEN by sampling a current flowing through the power line PL at a sampling frequency SPR, may generate the first current data IDT1 including an average sensing current, a minimum sensing current, and a maximum sensing current of a first period PRD1 based on the sensing currents ISEN, may generate the second current data IDT2 including an average sensing current, a minimum sensing current, and a maximum sensing current of a second period PRD2 based on the sensing currents ISEN, may generate the third current data IDT3 including an average sensing current, a minimum sensing current, and a maximum sensing current of a third period PRD3 based on the sensing currents ISEN, and may transmit the first current data IDT1, the second current data IDT2, and the third current data IDT3 to the timing controller 600. The current sensor 501 may include an analog-to-digital converter 510, a first current data generator 521, a second current data generator 522, a third current data generator 523, a current transmission memory 530, and a first controller 540.

The analog-to-digital converter 510 may convert a voltage VSEN between opposite terminals of a sensing resistor RSEN connected to the power line PL into the sensing currents ISEN based on the sampling frequency SPR. The analog-to-digital converter 510 may provide the sensing currents ISEN to the first current data generator 521, the second current data generator 522, and the third current data generator 523.

The third current data generator 523 may generate the third current data IDT3 including the average sensing current, the minimum sensing current, and the maximum sensing current of the third period PRD3 based on the sensing currents ISEN, a vertical start signal STV, a third frame count FC3, and a third sensing count SC3. The third period PRD3 may be synchronized by the vertical start signal STV. The third frame count FC3 may be the number of frame periods FRM included in the third period PRD3. When the third frame count FC3 is 0, the third frame count FC3 may be disabled. The third sensing count SC3 may be the number of sensing periods SPD included in the third period PRD3. When the third sensing count SC3 is 0, the third sensing count SC3 may be disabled.

The third current data generator 523 may generate the third current data IDT3 based on the sensing currents ISEN sensed a number of times corresponding to the sampling frequency SPR during the third period PRD3. The third current data generator 523 may provide the third current data IDT3 to the current transmission memory 530.

The average sensing current of the third period PRD3 may be an average value of the sensing currents ISEN in the third period PRD3. The minimum sensing current of the third period PRD3 may be a minimum value of the sensing currents ISEN in the third period PRD3. The maximum sensing current of the third period PRD3 may be a maximum value of the sensing currents ISEN in the third period PRD3.

The third period PRD3 may be longer than the first period PRD1. In an embodiment, the third period PRD3 may be equal to a plurality of frame periods FRD. For example, the third period PRD3 may be equal to two frame periods FRD. In this case, the third frame count FC3 may be 2, and the third sensing count SC3 may be 0.

The current transmission memory 530 may store the first current data IDT1, the second current data IDT2, and the third current data IDT3. The current transmission memory 530 may transmit the first current data IDT1, the second current data IDT2, and the third current data IDT3 to the timing controller 600.

The timing controller 600 may communicate with the current sensor 501 every frame period FRM. The timing controller 600 may include a current receiving memory 610, a second controller 620, and a net power controller 630.

The current receiving memory 610 may receive the first current data IDT1, the second current data IDT2, and the third current data IDT3 from the current transmitting memory 530, and may store the first current data IDT1, the second current data IDT2, and the third current data IDT3. The current receiving memory 610 may provide the first current data IDT1, the second current data IDT2, and the third current data IDT3 to the second controller 620.

The second controller 620 may control the image data IMG and/or the power supply 400 based on the first current data IDT1, the second current data IDT2, and the third current data IDT3. In an embodiment, the second controller 620 may include a global current manager 621, an over-current protector 622, and a current sensing burnt protector 623.

The global current manager 621 may control a grayscale of the image data IMG based on the average sensing current of the first current data IDT1, the average sensing current of the second current data IDT2, the average sensing current of the third current data IDT3, and a load LOAD of the image data IMG. The global current manager 621 may calculate a global current from the load LOAD and may compare the average sensing current of the first current data IDT1, the average sensing current of the second current data IDT2, and the average sensing current of the third current data IDT3 with the global current, and may control the grayscale of the image data IMG to reduce a power consumption of the display panel 100.

The over-current protector 622 may generate a second control signal CS2 for controlling a supply of the driving voltage ELVDD to the display panel 100 based on the maximum sensing current of the first current data IDT1, the maximum sensing current of the second current data IDT2, the maximum sensing current of the third current data IDT3, and the load LOAD. The over-current protector 622 may calculate a global current from the load LOAD, and may compare the maximum sensing current of the first current data IDT1, the maximum sensing current of the second current data IDT2, and the maximum sensing current of the third current data IDT3 with a reference current having a predetermined ratio with respect to the global current to generate the second control signal CS2. For example, when one of the maximum sensing current of the first current data IDT1, the maximum sensing current of the second current data IDT2, and the maximum sensing current of the third current data IDT3 is greater than the reference current, the over-current protector 622 may generate the second control signal CS2 for blocking the supply of the driving voltage ELVDD to the display panel 100.

The current sensing burnt protector 623 may generate a third control signal CS3 for controlling a supply of the driving voltage ELVDD to the display panel 100 based on the minimum sensing current and the maximum sensing current of the first current data IDT1, the minimum sensing current and the maximum sensing current of the second current data IDT2, and the minimum sensing current and the maximum sensing current of the third current data IDT3. The current sensing burnt protector 623 may compare the minimum sensing current and the maximum sensing current of the first current data IDT1, the minimum sensing current and the maximum sensing current of the second current data IDT2, and the minimum sensing current and the maximum sensing current of the third current data IDT3 with a reference current that is a reference for determining whether or not the burnt occurs to generate the third control signal CS3. For example, when one of the minimum sensing current and the maximum sensing current of the first current data IDT1, the minimum sensing current and the maximum sensing current of the second current data IDT2, and the minimum sensing current and the maximum sensing current of the third current data IDT3 are greater than the reference current, the current sensing burnt protector 623 may generate the third control signal CS3 for blocking the supply of the driving voltage ELVDD to the display panel 100.

Figure 7:
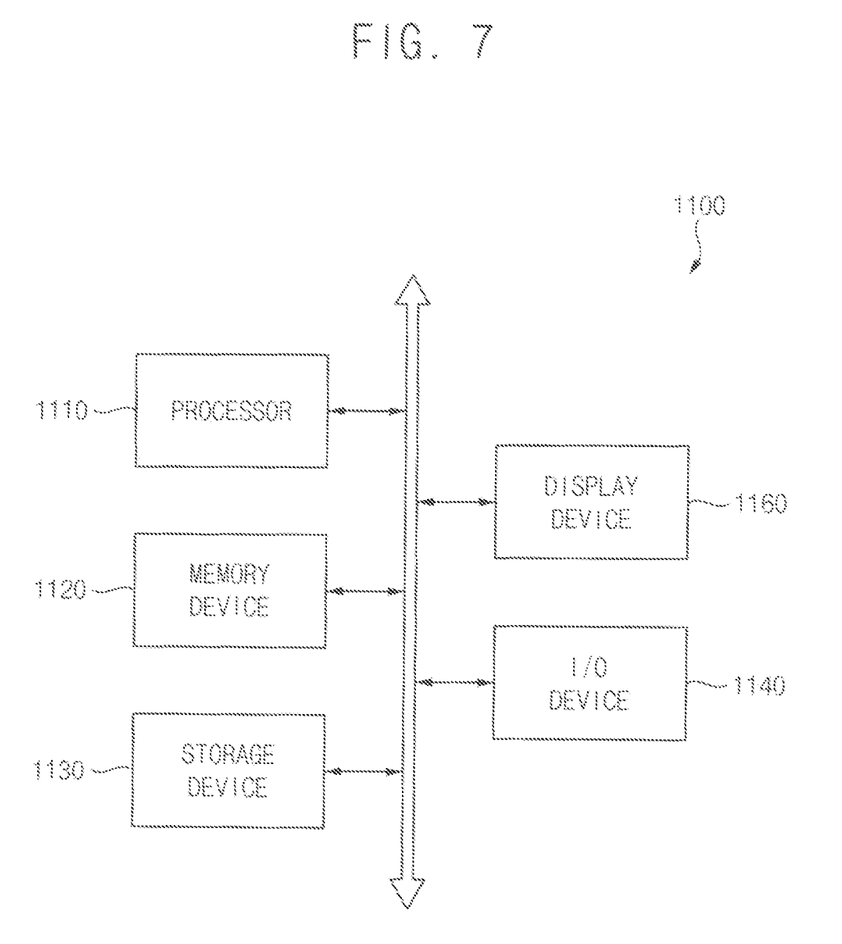
FIG. 7 is a block diagram illustrating an electronic apparatus including a display device according to an embodiment.

FIG. 7 is a block diagram illustrating an electronic apparatus 1100 including a display device 1160 according to an embodiment.

Referring to FIG. 7, the electronic apparatus 1100 may include a processor 1110, a memory device 1120, a storage device 1130, an input/output ("I/O") device 1140, and a display device 1160. The electronic apparatus 1100 may further include a plurality of ports for communicating with a video card, a sound card, a memory card, a universal serial bus ("USB") device, etc.

The processor 1110 may perform particular calculations or tasks. In an embodiment, the processor 1110 may be a microprocessor, a central processing unit ("CPU"), or the like. The processor 1110 may be coupled to other components via an address bus, a control bus, a data bus, or the like. In an embodiment, the processor 1110 may be coupled to an extended bus such as a peripheral component interconnection ("PCI") bus.

The memory device 1120 may store data for operations of the electronic apparatus 1100. In an embodiment, the memory device 1120 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 1130 may include a solid state drive ("SSD") device, a hard disk drive ("HDD") device, a CD-ROM device, or the like. The I/O device 1140 may include an input device such as a keyboard, a keypad, a touchpad, a touch-screen, a mouse device, etc., and an output device such as a speaker, a printer, etc. The display device 1160 may be coupled to other components via the buses or other communication links.

In the display device 1160, the current sensor may generate the various sensing currents, so that the sensing currents suitable for different controllers may be provided. Further, the current sensor may include the first controller, so that the sensing currents may be quickly provided to the first controller.

The display device according to the embodiments may be applied to a display device included in a computer, a notebook, a mobile phone, a smart phone, a smart pad, a PMP, a PDA, an MP3 player, or the like.

Although the display devices and the current sensors according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
   a display panel which displays an image based on image data;
   a power supply which provides a driving voltage to the display panel through a power line;
   a current sensor which generates first current data including an average sensing current, a minimum sensing current, and a maximum sensing current of a first period based on sensing currents generated by sampling a current flowing through the power line at a sampling frequency, generates second current data including an average sensing current, a minimum sensing current, and a maximum sensing current of a second period shorter than the first period based on the sensing currents, and includes a first controller controlling the image data or the power supply based on the second current data; and
   a timing controller which communicates with the current sensor every frame period and includes a second controller controlling the image data or the power supply based on the first current data and the second current data,
   wherein the second controller includes a global current manager which controls a grayscale of the image data based on the average sensing current of the first current data, the average sensing current of the second current data, and a load of the image data.

2. The display device of claim 1, wherein the second period is shorter than a frame period.

3. The display device of claim 1, wherein the current sensor further includes:
   a first current data generator which generates the first current data based on the sensing currents; and
   a second current data generator which generates the second current data based on the sensing currents.

4. The display device of claim 3, wherein the current sensor further includes a third current data generator which generates third current data including an average sensing current, a minimum sensing current, and a maximum sensing current of a third period longer than the first period based on the sensing currents.

5. The display device of claim 4, wherein the first period is equal to the frame period, and
   wherein the third period is equal to a plurality of frame periods.

6. The display device of claim 3, wherein the current sensor further includes an analog-to-digital converter which converts a voltage between opposite terminals of a sensing resistor connected to the power line into the sensing currents based on the sampling frequency.

7. The display device of claim 3, wherein the current sensor further includes a current transmission memory which stores the first current data and the second current data, and
   wherein the timing controller further includes a current receiving memory which receives the first current data and the second current data from the current transmission memory and stores the first current data and the second current data.

8. The display device of claim 7, wherein the current transmission memory and the current receiving memory communicate using an I2C interface.

9. The display device of claim 1, wherein the first controller includes an over-current detector which generates a control signal for controlling a magnitude of the driving voltage based on the second current data.

10. The display device of claim 1, wherein the timing controller further includes net power controller which generates the load of the image data based on the image data.

11. The display device of claim 1, wherein the second controller further includes a current detection burnt protector which generates a control signal for controlling a supply of the driving voltage to the display panel based on the minimum sensing current and the maximum sensing current of the first current data, and the minimum sensing current and the maximum sensing current of the second current data.

12. A display device, comprising:
a display panel which displays an image based on image data;
a power supply which provides a driving voltage to the display panel through a power line;
a current sensor which generates first current data including an average sensing current, a minimum sensing current, and a maximum sensing current of a first period based on sensing currents generated by sampling a current flowing through the power line at a sampling frequency, generates second current data including an average sensing current, a minimum sensing current, and a maximum sensing current of a second period shorter than the first period based on the sensing currents, and includes a first controller controlling the image data or the power supply based on the second current data; and
a timing controller which communicates with the current sensor every frame period and includes a second controller controlling the image data or the power supply based on the first current data and the second current data,
wherein the second controller includes an over-current protector which generates a control signal for controlling a supply of the driving voltage to the display panel based on the maximum sensing current of the first current data, the maximum sensing current of the second current data, and the load of the image data.

13. A current sensor, comprising:
a first current data generator which generates first current data including an average sensing current, a minimum sensing current, and a maximum sensing current of a first period based on sensing currents generated by sampling a current flowing through a power line, which provides a driving voltage to a display panel from a power supply, at a sampling frequency;
a second current data generator which generates second current data including an average sensing current, a minimum sensing current, and a maximum sensing current of a second period shorter than the first period based on the sensing currents; and
a controller which controls an image data or the power supply based on the second current data,
wherein the current sensor transmits the first current data and the second current data to a timing controller every frame period, and
wherein the timing controller includes a global current manager which controls a grayscale of the image data based on the average sensing current of the first current data, the average sensing current of the second current data, and a load of the image data.

14. The current sensor of claim 13, wherein the second period is shorter than a frame period.

15. The current sensor of claim 13, further comprising:
a third current data generator which generates third current data including an average sensing current, a minimum sensing current, and a maximum sensing current of a third period longer than the first period based on the sensing currents.

16. The current sensor of claim 15, wherein the first period is equal to a frame period, and
wherein the third period is equal to a plurality of frame periods.

17. The current sensor of claim 13, further comprising:
an analog-to-digital converter which converts a voltage between opposite terminals of a sensing resistor connected to the power line into the sensing currents based on the sampling frequency.

18. The current sensor of claim 13, further comprising:
a current transmission memory which stores the first current data and the second current data, and transmits the first current data and the second current data to the timing controller.

19. The current sensor of claim 13, wherein the controller includes an over-current detector which generates a control signal for controlling a magnitude of the driving voltage based on the second current data.

* * * * *